(12) United States Patent
Sumiya et al.

(10) Patent No.: US 7,373,899 B2
(45) Date of Patent: May 20, 2008

(54) PLASMA PROCESSING APPARATUS USING ACTIVE MATCHING

(75) Inventors: Masahiro Sumiya, Kudamatsu (JP); Naoki Yasui, Kudamatsu (JP); Seiichi Watanabe, Tokuyama (JP); Hitoshi Tamura, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 248 days.

(21) Appl. No.: 10/954,074

(22) Filed: Sep. 30, 2004

(65) Prior Publication Data

US 2005/0034813 A1 Feb. 17, 2005

Related U.S. Application Data

(62) Division of application No. 09/946,618, filed on Sep. 6, 2001, now Pat. No. 6,806,201.

(30) Foreign Application Priority Data

Sep. 29, 2000 (JP) ............................. 2000-302824
Nov. 27, 2000 (JP) ............................. 2000-364537

(51) Int. Cl.
*H01L 21/00* (2006.01)
(52) U.S. Cl. .................. 118/723 E; 156/345.47
(58) Field of Classification Search .......... 118/723 E; 156/345.43, 345.44, 345.45, 345.46, 345.47
See application file for complete search history.

(56) References Cited

U.S. PATENT DOCUMENTS

| 5,891,252 | A | 4/1999 | Yokogawa et al. |
|---|---|---|---|
| 5,900,103 | A | 5/1999 | Tomoyasu et al. |
| 6,110,287 | A | 8/2000 | Arai et al. |
| 6,404,134 | B2 | 6/2002 | Ishii |
| 7,029,594 | B2 * | 4/2006 | Yasui et al. .................. 216/61 |
| 7,169,255 | B2 * | 1/2007 | Yasui et al. ............ 153/345.28 |
| 2001/0009220 | A1 * | 7/2001 | Mizuno et al. .......... 204/192.1 |

FOREIGN PATENT DOCUMENTS

| JP | 6-338476 | | 12/1994 |
|---|---|---|---|
| JP | 7-249614 | | 9/1995 |
| JP | 08264515 | A * | 10/1996 |
| JP | 10-172959 | | 6/1998 |
| JP | 11-067741 | | 3/1999 |
| JP | 2000-276667 | | 9/2000 |

OTHER PUBLICATIONS

"Distribution of Ion Energies Incident on Electrodes in Capacitively Coupled rf Discharges", M. J. Kushner, J. Appl. Phys. 58, 4024 (1985).

* cited by examiner

*Primary Examiner*—Parviz Hassanzadeh
*Assistant Examiner*—Michelle Crowell
(74) *Attorney, Agent, or Firm*—Antonelli, Terry, Stout & Kraus, LLP.

(57) ABSTRACT

A plasma processing apparatus having a processing chamber connected to a vacuum exhauster so that its inside pressure can be reduced by the vacuum exhauster, a gas feed unit for supplying gas into the processing chamber, a substrate electrode provided in the processing chamber and on which a sample can be placed, an RF power supply connected through a matching circuit to the substrate electrode, plasma generating means for generating plasma within the processing chamber and a voltage waveform control circuit provided within the matching circuit or between the substrate electrode and the matching circuit to flatten the voltage waveform from the RF power supply.

14 Claims, 12 Drawing Sheets

PLASMA PROCESSING APPARATUS USING ACTIVE MATCHING

CROSS-REFERENCE TO RELATED APPLICATION

This application is a divisional of U.S. application Ser. No. 09/946,618, filed Sep. 6, 2001, now U.S. Pat. No. 6,806,201, and relates to an application U.S. Ser. No. 09/946,491, filed by Shumiya et al based on JP 2000-276667 filed on Sep. 12, 2000 and assigned to the present assignee, now U.S. Pat. No. 6,875,366. The contents of that application are incorporated herein by reference.

BACKGROUND OF THE INVENTION

1. Field of the Invention

The present invention relates to plasma processing apparatus and method, and particularly to a plasma processing apparatus and method suitable for making surface treatment of a sample such as a semiconductor device by use of plasma.

2. Description of the Related Art

In the etching process using plasma, the processing gas is ionized to be activated for fast processing, and radio frequency (RF) biasing power is supplied to the processed sample so that the ions in the plasma can be incident perpendicularly to a sample to be processed (or a processed sample), thereby achieving high-precision etching for anisotropic shape and so on.

A plasma processing apparatus for this purpose is disclosed in U.S. Pat. No. 5,891,252, issued to Yokogawa, et al. This apparatus, as described in that document, has an air-core coil provided on the outer periphery of the outside of a vacuum vessel, and a circular conductor plate provided to oppose a wafer stage or substrate electrode within the vacuum vessel. In addition, an UHF band power supply and a first RF power supply are connected to the circular conductor plate, while a second RF power supply is connected to the wafer stage, so that an electric field of UHF band and anther electric field of frequencies different from the UHF band are superimposed and applied to the circular conductor plate. Thus, plasma is generated by use of electron cyclotron resonance due to the mutual action between the electromagnetic waves from the UHF band power supply and the magnetic field from the air-core coil. The superimposed RF voltage from the first RF power supply increases the bias voltage to the circular conductor plate so that the circular conductor plate and the plasma can be reacted to more produce activated species that contribute to the etching, and the second RF power supply connected to the wafer stage controls the energy of ions incident to the sample in the plasma.

SUMMARY OF THE INVENTION

In this conventional apparatus, the energy of ions incident to the processed sample is determined by the self-bias potential that is caused by the biasing power fed to the processed sample, and since the rate of the earthed area to the substrate electrode is reduced as the wafer size, or diameter increases, a large amount of electrons from the plasma cannot be supplied to the substrate electrode. Therefore, the $V_{dc}/V_{pp}$ ratio becomes small, and the plasma potential increases. Thus, such problems occur as to reduce the efficiency of applying the RF bias, to cause metal contaminant resulting from the sputtering of ions in the plasma to the earth electrode and side wall materials, and to increase particles due to the diffusion of the plasma into the space below the processing chamber.

In addition, since a sinusoidal RF electric field is applied to the wafer stage (, or substrate electrode), the ion energy distribution is fixed under the RF bias of a fixed frequency. Thus, when a processed sample as represented by SAC (Self Aligned Contact) is tried to process with the etching speed maintained constant as the semiconductor device is microstructured more and more, the selectivity to mask and base material is small, and hence it is difficult to process with high precision.

It is the first object of the invention to provide a plasma processing method and apparatus capable of making high-precision surface treatment with the selectivity to the mask and/or base material kept large enough.

It is the second object of the invention to provide a plasma processing method and apparatus capable of suppressing the plasma potential from being raised, and thereby suppressing the metal contaminant and particles from being increased.

The above objects can be achieved by providing a plasma processing method for processing a sample by plasma while bias voltages to plasma generation and the sample are each being controlled independently, this method having the steps of applying an RF voltage as one of the bias voltages to a substrate electrode, and flattening the voltage waveform of the RF voltage at an arbitrary voltage level.

In the above method, the voltage waveform of the negative voltage side of the RF voltage to the substrate electrode is flattened.

The voltage waveform of the positive voltage side of the RF voltage to the substrate electrode is flattened.

The voltage waveforms of the positive and negative voltage sides of the RF voltage to the substrate electrode are flattened.

The plasma processing method further has the steps of providing an electrode opposite to the substrate electrode, applying RF voltages of the same frequency to both the electrodes, and controlling the phases of the RF voltages.

According to one aspect of the invention in order to achieve the above objects, there is provided a plasma processing apparatus including a processing chamber connected to a vacuum exhauster so that its inside pressure can be reduced by the vacuum exhauster, a gas feed unit for supplying gas into the processing chamber, a substrate electrode provided in the processing chamber and on which a sample can be placed, an RF power supply connected through a matching circuit to the substrate electrode, plasma generating means for producing plasma in the processing chamber, and a voltage waveform control circuit provided within the matching circuit or between the substrate electrode and the matching circuit to flatten the voltage waveform from the RF power supply.

In the above apparatus, the voltage waveform control circuit flattens the negative voltage side of the RF voltage waveform to the substrate electrode at an arbitrary voltage level.

The voltage waveform control circuit flattens the positive voltage side of the RF voltage waveform to the substrate electrode at an arbitrary voltage level.

The voltage waveform control circuit flattens the positive and negative voltage sides of the RF voltage waveform to the substrate electrode at arbitrary voltage levels.

The voltage waveform control circuit includes a semiconductor device and a DC voltage source.

The plasma processing apparatus further includes an electrode opposite to the substrate electrode, and another RF power supply connected to the opposite electrode.

Also, the frequencies of the RF voltages applied to the two electrodes are made equal, and the plasma processing apparatus further includes a phase control for controlling the phases of the RF voltages.

According to another aspect of the invention, there is provided a plasma processing method for processing a sample by plasma while bias voltages to plasma generation and the sample are each being independently controlled, the method having the steps of applying an RF voltage as one of the bias voltages to a substrate electrode, and flattening the positive and negative voltage sides of the voltage waveform of the RF voltage at arbitrary voltage levels.

The above method further has the steps of providing an electrode opposite to the substrate electrode, applying RF voltages of the same frequency to both the electrodes, and controlling the phases of the RF voltages.

The phases of the RF voltages are made to have a difference of 180°±30°.

According to another aspect of the invention, there is provided a plasma processing apparatus including a processing chamber connected to a vacuum exhauster so that its inside pressure can be reduced by the vacuum exhauster, a gas feed unit for supplying gas into the processing chamber, a substrate electrode provided in the processing chamber and on which a sample can be placed, an RF power supply connected through a matching circuit to the substrate electrode, plasma generating means for producing plasma in the processing chamber, and a voltage waveform control circuit provided within the matching circuit or between the substrate electrode and the matching circuit to flatten the positive and negative voltage sides of the RF voltage waveform at arbitrary voltage levels.

In the above apparatus, the voltage waveform control circuit has a diode and a DC voltage source.

The apparatus further includes an electrode opposite to the substrate electrode, and another RF power supply connected to the opposite electrode.

Also, in the apparatus, the frequencies of the RF voltages applied to the two electrodes are made equal, and the apparatus further includes a phase control for controlling the phases of the RF voltages.

The phase control can control the phases to have a difference of 180°±30°.

According to another aspect of the invention, there is provided a plasma processing method for processing a sample in a processing chamber in which plasma is produced, the method having the steps of applying an RF voltage to a substrate electrode on which the sample is placed, and flattening the voltage waveform of the RF voltage at an arbitrary voltage level.

In the above method, the voltage waveform of at least one of the positive and negative voltages of the RF voltage applied to the substrate electrode is flattened.

According to another aspect of the invention, there is provided a plasma processing apparatus including a processing chamber connected to a vacuum exhauster so that its inside pressure can be reduced by the vacuum exhauster, a gas feed unit for supplying gas into the processing chamber, a substrate electrode provided in the processing chamber and on which a sample can be placed, an RF power supply connected through a matching circuit to the substrate electrode, and a voltage waveform control circuit provided within the matching circuit or between the substrate electrode and the matching circuit to flatten the voltage waveform at an arbitrary voltage level.

In the above apparatus, the voltage waveform control circuit can flatten at least one of the voltage waveforms of the positive and negative voltages of the RF voltage applied to the substrate electrode.

Thus, the energy distribution of ions incident to the sample can be controlled by controlling the RF voltage waveform applied to the substrate electrode, so that the ion energy can contribute chiefly to the etching of the processed sample, but does not contribute to the etching of the mask and base material. Therefore, high-precision surface processing can be carried out with the etching speed not greatly changed and with the selectivity to the mask and base material assured to be large enough.

In addition, by flattening the negative voltage of the RF voltage to the substrate electrode, it is possible to narrow the width of the widely spread ion energy distribution, to obtain the energy distribution in which a large amount of ion energy useful for the processing is included, and hence to improve the efficiency of processing the sample by plasma.

Moreover, by flattening the positive voltage side together with the negative voltage side, it is possible to obtain stabilized plasma potential, and to stabilize the processing of the sample in the plasma. Also, since the influence of the plasma sheath characteristic distribution in the surface of the sample due to the plasma characteristic distribution in the surface is reduced, the charging damage can be suppressed, and thus high-precision etching can be carried out with less damage.

Furthermore, by providing an electrode opposite to the substrate electrode, applying the RF voltages of the same frequency to both the electrodes, and controlling the phase difference between the RF voltages to be 180°±30°, it is possible to suppress the potential of the positive voltage side of the RF voltage from increasing, and hence to obtain stabilized plasma potential, thus leading to the stabilization of plasma processing.

DETAILED DESCRIPTION OF THE EMBODIMENTS

Figure 1:
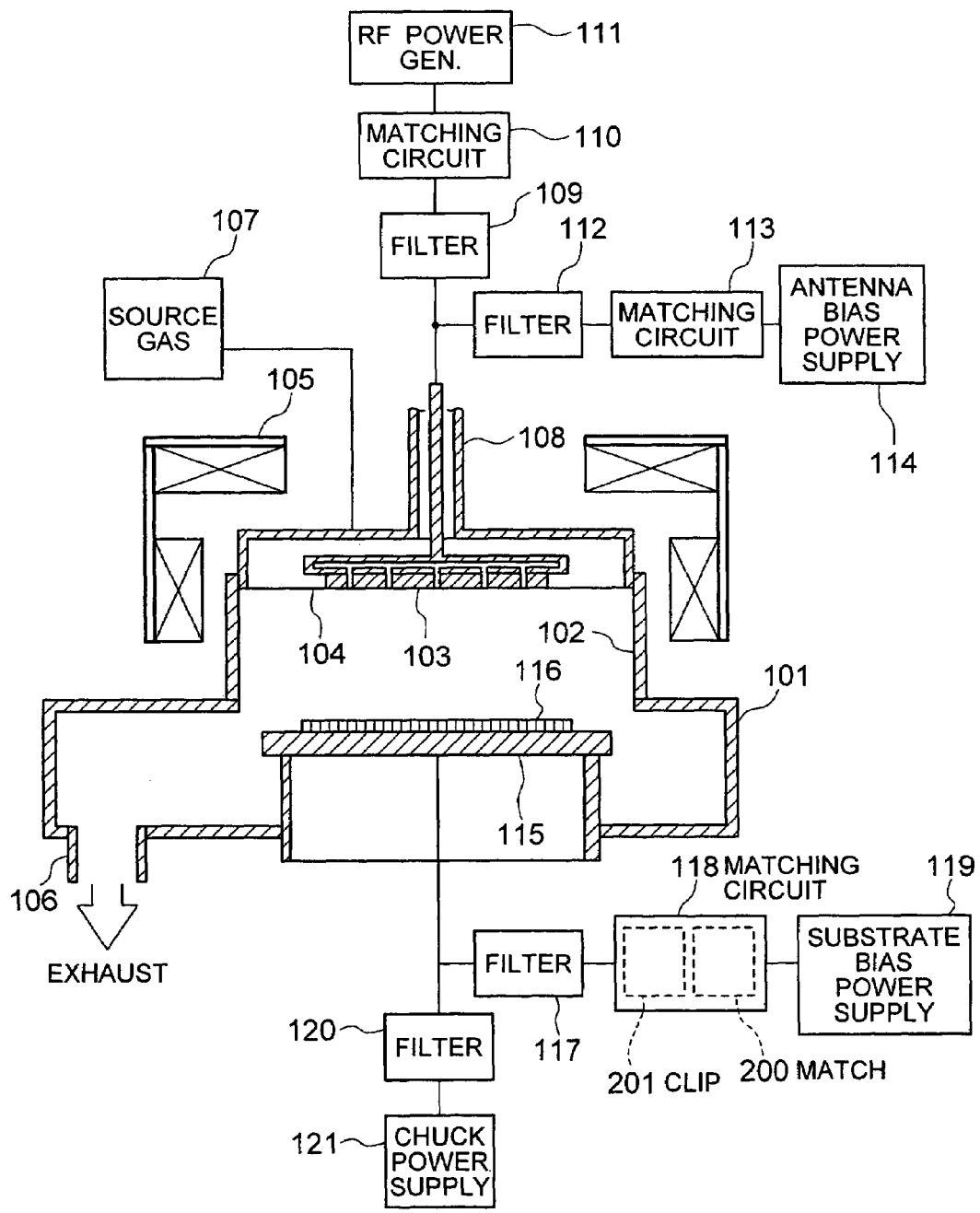
FIG. 1 is a longitudinally cross-sectional view of a plasma processing apparatus as the first embodiment of the invention.

One embodiment of the invention will be described with reference to FIGS. 1 through 5. FIG. 1 is a longitudinally cross-sectional view of an etching apparatus as one example of the plasma processing apparatus to which the present invention is applied. A vacuum vessel 101 has provided on the top opening side a cylindrical process container 102, a flat-shaped antenna electrode 103 of a conductor and a dielectric window 104 through which electromagnetic waves can be transmitted, so as to hermetically seal the opening to form a processing chamber inside the container. A field-producing coil 105 is provided around the outside of the process container 102 to surround the processing chamber. The antenna electrode 103 has a perforated structure for the supply of etching gas from a gas feed unit 107 connected to the antenna electrode. In addition, below the vacuum vessel 101 there is provided a vacuum exhauster (not shown) that is connected via a vacuum vent 106 to the vessel.

A coaxial line 108 is provided on the top of the antenna electrode 103 to be connected thereto, and the coaxial line 108 is further connected via a filter 109 and a matching circuit 110 to an RF power source 111 (of, for example, 450 MHz in frequency) for plasma generation. The antenna electrode 103 is also connected via the coaxial line 108, a filter 112 and a matching circuit 113 to an antenna biasing power supply 114 (of, for example, 13.56 kHz in frequency). Here, the filter 109 allows the RF power to be passed therethrough from the RF power source 111, but effectively cuts off the biasing power from the antenna biasing power supply 114. The filter 112 allows the biasing power to be passed therethrough from the antenna biasing power supply 114, but effectively cuts off the RF power from the RF power source 111.

A substrate electrode 115 which is a so-called "sample stage" on which a sample 116 to be processed can be placed is provided on the bottom side within the vacuum vessel 101. The substrate electrode 115 is connected via a filter 117 and a matching circuit 118 to a substrate biasing power supply 119 (of, for example, 800 kHz in frequency). A matching circuit is usually called as "matching box". However, the matching circuit 118 specific to this case is formed of a matching portion 200 on the power supply side and a clipper circuit 201 on the load side. The clipper circuit 201 may be separately provided instead of being incorporated in the matching circuit 118. The clipper circuit 201 flattens at an arbitrary level the RF voltage waveform from the substrate biasing power supply 119. The clipper circuit 201 has a function according to this embodiment as will be described later. The substrate electrode 115 is also connected via a filter 120 to an electrostatic chuck power supply 121 for electrostatic suction of the sample 116.

Here, the filter 117 allows the biasing power to be passed therethrough from the substrate biasing power supply 119, but effectively cuts off the RF power from the RF power source 111 and the biasing power from the antenna biasing power supply 114. Although the RF power is normally absorbed within the plasma, and thus does not flows to the substrate electrode 115 side, the filter 117 that also cuts off the RF power is provided for safety's sake. The filter 120 allows the DC power to be passed therethrough from the electrostatic chuck power supply 121, but effectively cuts off the power from the RF power source 111, antenna biasing power supply 114 and substrate biasing power supply 119.

Figure 2:
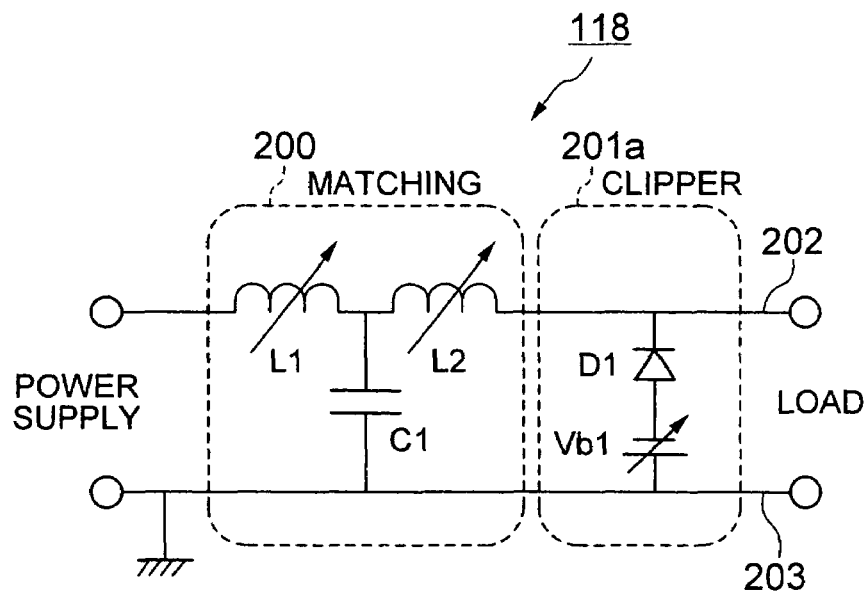
FIG. 2 is a circuit diagram of one example of the matching circuit or matching box in the apparatus of FIG. 1.
Figure 3:
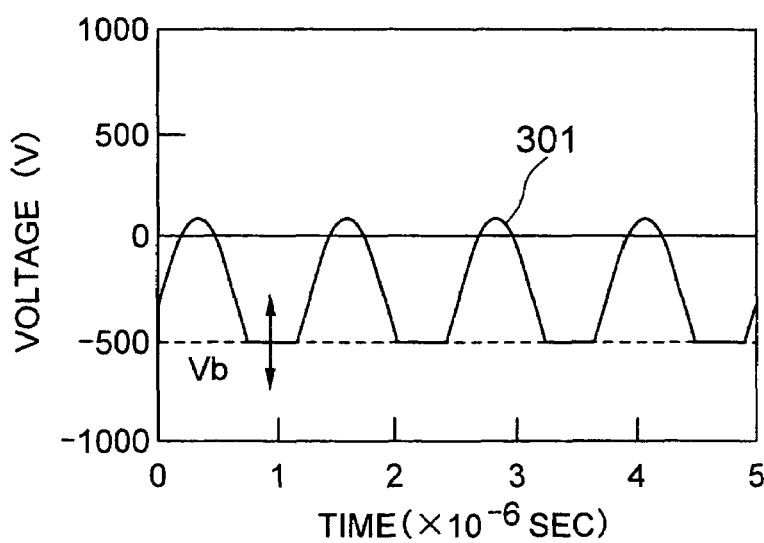
FIG. 3 is a graph showing an example of the voltage waveform controlled by use of the matching circuit of FIG. 2.

FIG. 2 shows an example of the circuit arrangement of the matching circuit 118. This matching circuit 18 has the matching portion 200 that is formed of inductors ($L_1$, $L_2$) and a capacitor ($C_1$) on the power supply side and the clipper circuit (smoothing circuit) 201a that is formed of a series of a diode ($D_1$) and a DC voltage source ($V_{b1}$) connected between an active line 202 and a ground line 203 on the load side. In this case, the diode ($D_1$) cuts off the negative side of the RF voltage, and the DC voltage source ($V_{b1}$) applies a negative potential to the diode. The operating voltage of the diode ($D_1$) is thus set by the negative potential from the DC voltage source ($V_{b1}$). Therefore, the voltage waveform can be clipped (flattened or cut off) at an arbitrary level by this circuit arrangement, and hence a voltage waveform 301 of the RF voltage can be obtained as shown in FIG. 3.

In this apparatus, after the inside pressure of the processing chamber is reduced by the vacuum exhauster (not shown), the gas feed unit 107 supplies a process gas, or an etching gas in this case into the processing chamber until a desired pressure can be reached. The RF power of, for example, 450 MHz in frequency from the RF power supply 111 is propagated through the coaxial line 108, antenna electrode 103 and dielectric window 104, and introduced into the processing chamber. The electric field by the RF power introduced into the processing chamber interacts with the magnetic field produced in the processing chamber by the field generating coil 105 (for example, solenoid coil) to produce high-density plasma within the chamber. Particularly when a magnetic field having an intensity (for example, 160 G) enough to cause electron cyclotron resonance is produced within the processing chamber, high-density plasma can be generated with high efficiency.

In addition, the RF power (of, for example, 13.56 MHz in frequency) from the antenna biasing power supply 114 is supplied through the coaxial line 108 to the antenna electrode 103. The RF voltage applied to the antenna electrode 103 from the antenna biasing power supply 114, when the antenna electrode is made of a desired material, causes this material to react with the radicals in the plasma, thus making it possible to control the constituents of the generated plasma. In the case of, for example, oxide film etching, if silicon Si is used for the material of the antenna electrode 103, the amount of F-radical in the plasma can be reduced that affects the etching characteristic on the oxide film, or the $SiO_2$/SiN selectivity particularly for SAC structure.

Also, the RF power of, for example, 800 kHz in frequency from the substrate biasing power supply 119 is applied to the sample 116 placed on the substrate electrode 115 so that the sample 116 on the substrate electrode 115 can be processed for its surface, or etched in this case.

In this apparatus, the plasma is produced chiefly by the RF power source 111 of 450 MHz, the plasma constituents or plasma distribution is controlled by the antenna biasing power supply 114, and the energy of ions of the plasma incident to the sample 116 is controlled by the substrate biasing power supply 119. Thus, this apparatus has the merit that the plasma generation (amount of ions) and plasma constituent (radical concentration ratio) can be independently controlled.

If the DC voltage source ($V_b$) in the clipper circuit 201a of this apparatus is selected to have an arbitrary voltage, the level $V_b$ of the voltage waveform 301 shown in FIG. 3 can be arbitrarily determined, or for example, the negative side of the sinusoidal voltage waveform of 800 KHz in frequency can be clipped at an arbitrary voltage level.

Figure 4A:
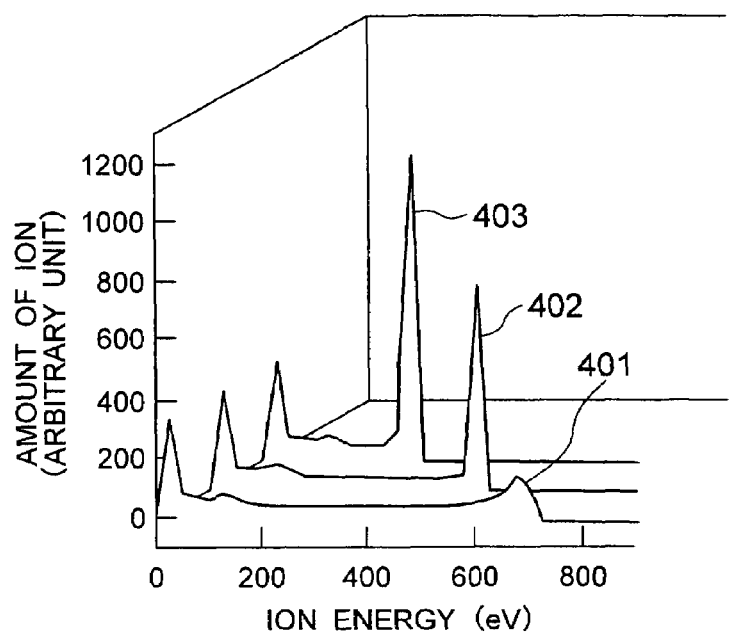
FIGS. 4A and 4B are graphs showing the relations of ion energy distributions and DC voltage ($V_b$) in FIG. 3.
Figure 4B:
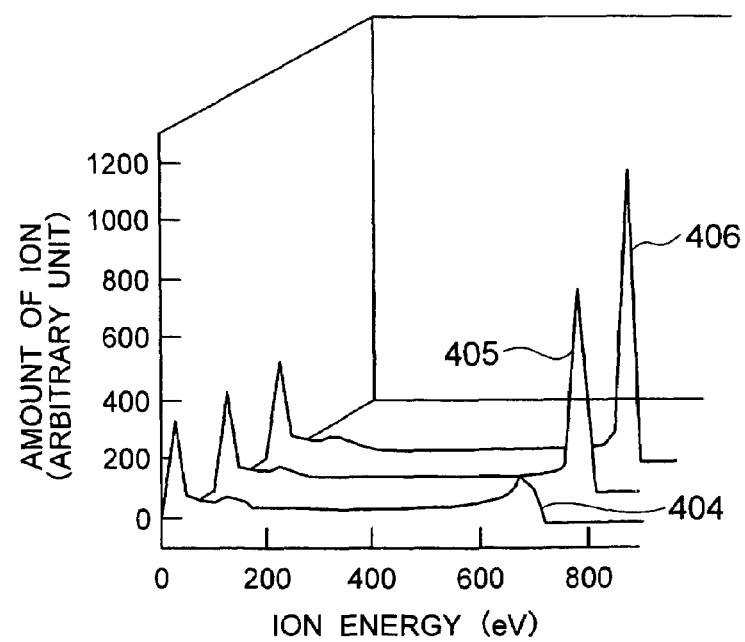
Figure 5:
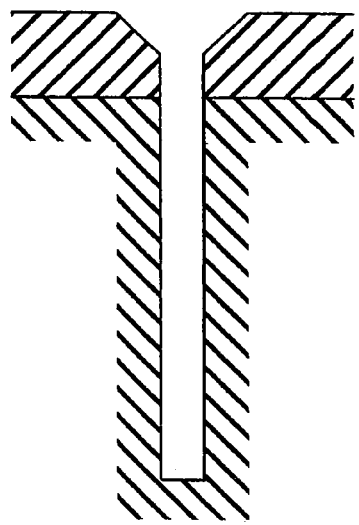
FIG. 5 is a longitudinally cross-sectional view of one example of the sample to be etched by use of the apparatus of FIG. 1.

FIG. 4A is a graph showing the energy distribution of ions incident to the sample 116 when the output from the substrate biasing power supply 119 is made constant, but when the clipping voltage ($V_b$) of the voltage waveform 301 is controlled by changing the DC source voltage ($V_{b1}$). FIG. 4B is a graph showing the energy distribution of ions incident to the sample 116 when the clipping voltage ($V_b$) of the voltage waveform 301 is made constant by fixing the DC source voltage ($V_{b1}$), but when the output from the substrate biasing power supply 119 is changed. In those figures, the ordinate represents the amount of ions, and the abscissa the ion energy. It is generally known that when RF power is supplied to a wafer, the ion energy distribution takes two peaks on the high-energy and low-energy sides as described in J. Appl. Phys. 58, 4024 (1985) written by M. J. Kushner. In FIG. 4A, three-dimensional waveforms are shown as an ion energy distribution waveform 401 obtained by applying a sinusoidal voltage waveform to the substrate electrode 115, an ion energy distribution waveform 402 by setting the clipping voltage ($V_b$) to be −500 V, and an ion energy distribution waveform 403 by setting the clipping voltage ($V_b$) to be −250 V. From FIG. 4A, it will be understood that the potential values of the ion energy much distributed on the high-energy side can be gradually shifted to the lower potential values by changing the clipping voltage ($V_b$) to −500 V, −250 V with the output from the substrate biasing power source 119 kept constant. In addition, the amounts of ions distributed on the high-energy side can be gradually increased by the change of clipping voltage.

In FIG. 4B, three-dimensional waveforms are shown as an ion energy distribution waveform 404 obtained by fixing the clipping voltage ($V_b$) to the substrate electrode 115 to be −500 V and selecting the output from the substrate biasing power supply 119 to be 500 V, an ion energy distribution waveform 405 by selecting the output from the substrate biasing power supply 119 to be 1000 W, and an ion energy distribution waveform 406 by selecting the output from the substrate biasing power supply 119 to be 1500 W. From FIG. 4B, it will be understood that the amounts of ions of which the ion energy is distributed on the high-energy side can be gradually increased by gradually increasing the output from the substrate biasing power supply 119 with the clipping voltage ($V_b$) kept constant.

Thus, the ion energy distribution can be controlled by adjusting the biasing voltage waveform to the substrate electrode 115, and more precisely controlled by changing the output from the substrate biasing power supply together with the waveform adjustment. Accordingly, since ions having arbitrary ion energy can be efficiently made incident to the sample 116, it is possible to easily form deep holes (an aspect ratio of 20 of 0.1 μm in diameter and 2 μm in depth), or HARC (High Aspect Ratio Contact) in $SiO_2$ film or a deep trench in Si substrate as, for example, shown in FIG. 5.

In addition, since the ion energy can be selected/controlled to be so effective to the sample but not effective to the mask and the base material, the selectivity of the ion energy to the mask and the base material can be improved for the etching processing. Thus, high-quality etching processing can be carried out.

Since the oxide film etching involves incidence of high-energy ions to the oxide film, the base film or the like might undergo lattice defect, or be damaged. However, the ion energy controlling ability of this embodiment makes it possible to etch the sample at a correct rate with no damage to the base material, and to make high-quality surface processing with high throughput and high yield.

Second Embodiment

Figure 6:
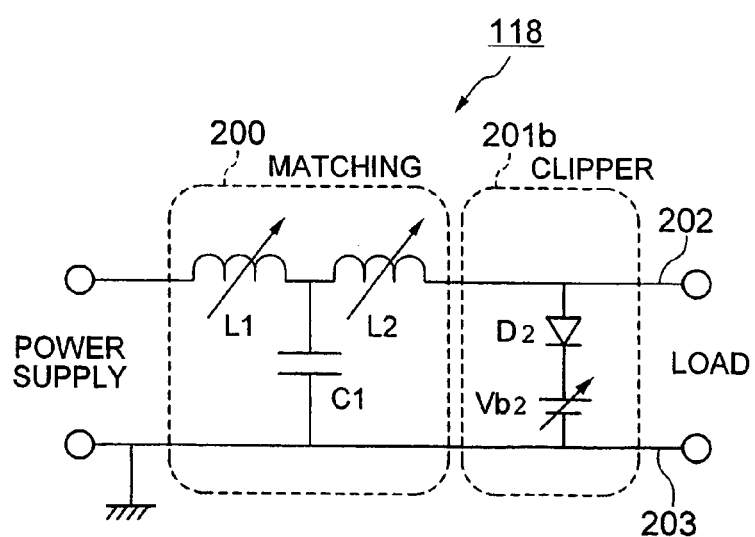
FIG. 6 is a circuit diagram of another example of the matching circuit in the apparatus of FIG. 1 as the second embodiment of the invention.

The second embodiment of the invention will be described with reference to FIGS. 6 through 9. FIG. 6 shows an example of the circuit arrangement of the matching circuit 118. The arrangement of FIG. 6 is different from that of FIG. 2 in that the diode ($D_2$) and DC voltage source ($V_{b2}$) of a clipper circuit (smoothing circuit) 201b are serially connected with their polarities inverted to those of the diode ($D_1$) and DC voltage source ($V_{b1}$) of the clipper circuit 201a. In this case, the diode ($D_2$) acts to cut off the positive side of the RF voltage, and the DC voltage source ($V_{b2}$) supplies a positive potential. Thus, the operating voltage of the diode ($D_2$) is determined by the potential value of the DC voltage source ($V_{b2}$). This circuit arrangement makes it possible to clip (flatten or cut off) the voltage waveform at an arbitrary voltage level, thus producing a voltage waveform 302 of RF voltage as shown in FIG. 7.

Figure 7:
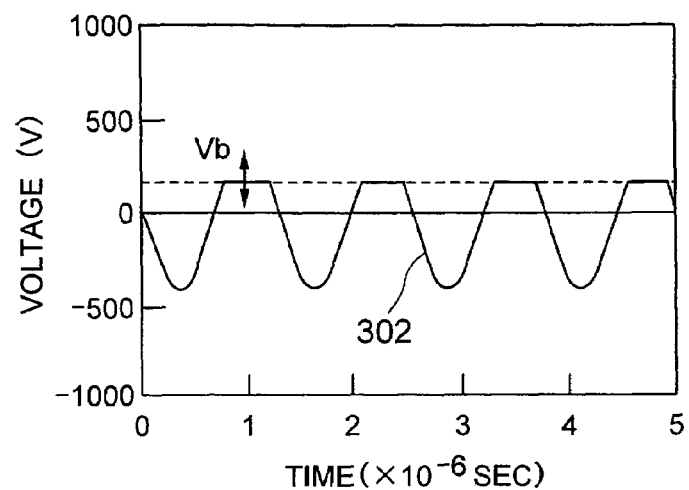
FIG. 7 is a graph showing an example of the voltage waveform controlled by use of the matching circuit of FIG. 6.

If the DC voltage source ($V_{b2}$) in the clipper circuit 201b of this apparatus is changed in its voltage to have an arbitrary clipping voltage, the voltage Vb of the voltage waveform 302 shown in FIG. 7 can be arbitrarily set, or the positive side of a sinusoidal voltage waveform of, for example, 800 kHz in frequency can be clipped at an arbitrary voltage level.

Figure 8:
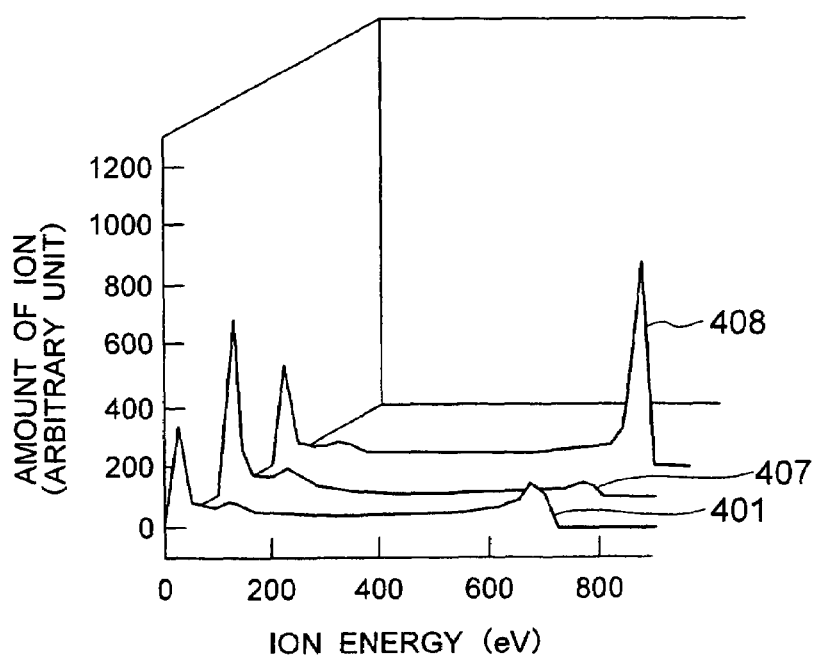
FIG. 8 is a graph showing the relations of the DC voltage ($V_b$) in FIG. 7 and the ion energy distribution.
Figure 9:
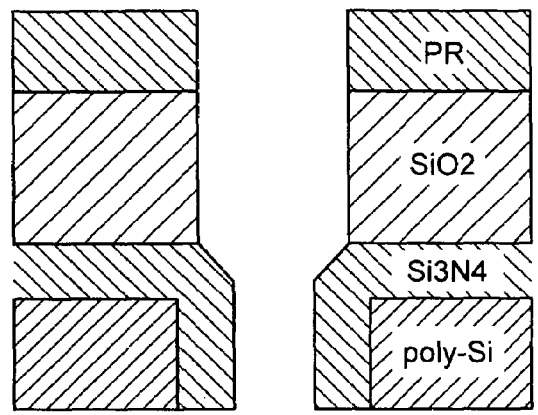
FIG. 9 is a longitudinally cross-sectional view of another example of the sample to be etched by use of the matching circuit of FIG. 6.

FIG. 8 is a graph showing energy distributions of ions incident to the sample 116 with the DC voltage source ($V_{b2}$) changed to control the voltage waveform 302. In FIG. 8, the ordinate represents the amount of ions, and the abscissa the ion energy. In FIG. 8, distribution waveforms are shown as the ion energy distribution waveform 401 with a sinusoidal voltage waveform applied to the substrate electrode 115, an ion energy distribution waveform 407 with the positive voltage side clipping voltage ($V_b$) fixed to 50 V, and an ion energy distribution waveform 408 with the negative voltage side clipping voltage ($V_b$) fixed to −600 V. From FIG. 8, it will be understood that when the clipping voltage ($V_b$) is fixed to 50 V to lower the plasma potential, it is possible to reduce the potential values of the ion energy much distributed on the high-energy side and increase the amount of ions distributed on the low-energy side. Also, as will be understood from FIG. 8, distributions having a large amounts of ions on the high-energy side and low-energy side can be obtained by clipping the negative and positive voltage side of the voltage waveform, respectively.

Therefore, the ion energy distribution can be controlled by adjusting the bias voltage waveform to the substrate electrode 115. Thus, since ions having arbitrary energy can be efficiently made incident to the sample 116, etching of SAC that needs a proper selectivity to the base material as, for example, shown in FIG. 9 can be effectively carried out by using the distribution in which the amount of ions is much on the low ion-energy side.

Third Embodiment

Figure 10:
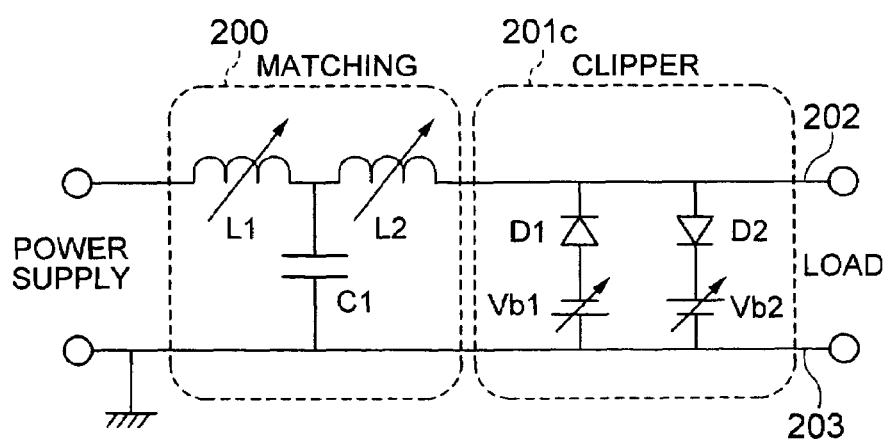
FIG. 10 is a circuit diagram of another example of the matching circuit in the apparatus of FIG. 1 as the third embodiment of the invention.

The third embodiment of the invention will be described with reference to FIGS. 10 through 12. FIG. 10 shows another example of the circuit arrangement of the matching circuit 118 as the third embodiment. On the load side of the matching portion 200 formed of the inductors ($L_1$, $L_2$) and capacitor ($C_1$), a clipper circuit (smoothing circuit) 201c is connected that has diodes ($D_1$, $D_2$) and DC voltage sources ($V_{b1}$, $V_{b2}$) connected in series between the active line 202 and ground line 203. The diode ($D_1$) acts to cut off the negative voltage side of the RF voltage, and the DC voltage source ($V_{b1}$) supplies a negative potential. Thus, the operating voltage of the diode ($D_1$) is determined by the voltage level of the DC voltage source ($V_{b1}$). The diode ($D_2$) cuts off the positive voltage side of the RF voltage, and the DC voltage source ($V_{b2}$) supplies a positive potential. Thus, the operating voltage of the diode ($D_2$) can be determined by the voltage level of the DC voltage source ($V_{b2}$). This circuit arrangement makes it possible to clip (flatten or cut off) the voltage waveform at arbitrary voltage levels on the positive and negative voltage sides, producing a voltage waveform 303 of RF voltage as shown in FIG. 12. FIG. 12 shows the voltage waveform 303 to be applied to the substrate electrode 115 from the clipper circuit 201c of the matching circuit 118. In FIG. 12, the ordinate represents the voltage, and the abscissa the time.

Figure 11:
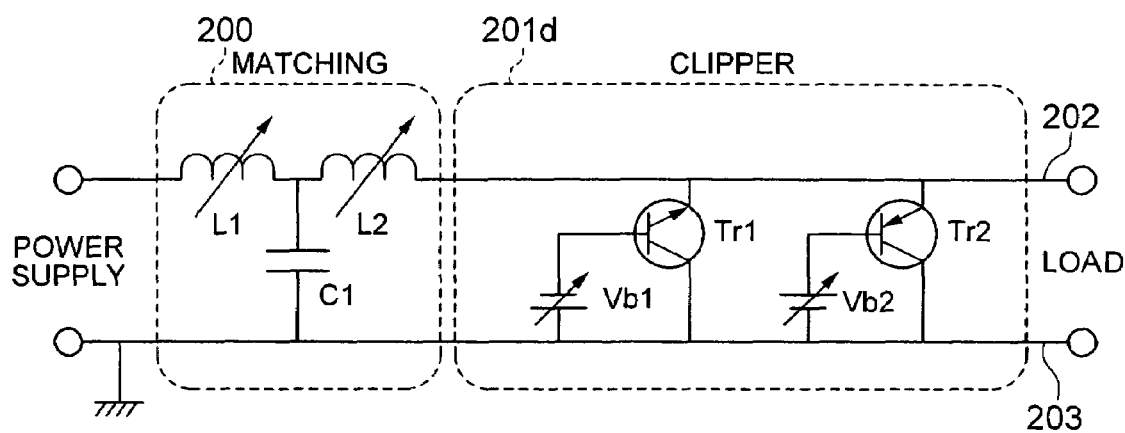
FIG. 11 is a circuit diagram of another example of the matching circuit of FIG. 10.
Figure 12:
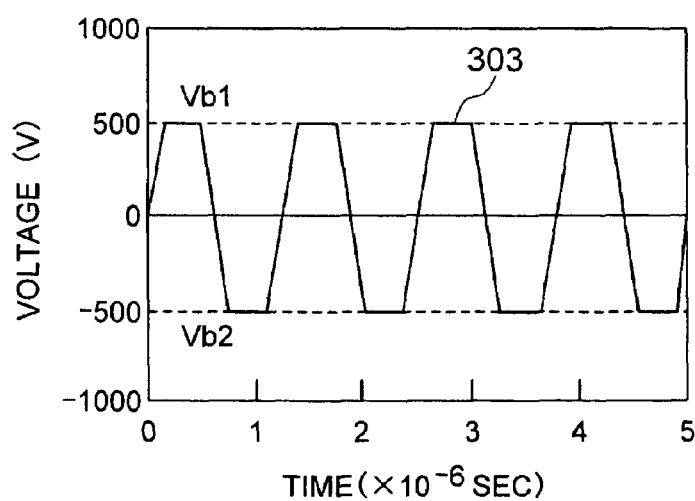
FIG. 12 is a graph showing an example of the voltage waveform controlled by use of the matching circuits of FIGS. 10 and 11.

FIG. 11 shows another example of the matching circuit 118. In this matching circuit, on the load side of the matching portion 200, switching elements, for example, transistors $T_{r1}$, $T_{r2}$ are connected to the active line 202, and the DC voltage sources $V_{b1}$, $V_{b2}$ are connected between the ground line 23 and the base electrodes of the transistors $T_{r1}$, $T_{r2}$, thereby constituting a clipper circuit 201d. In this clipper circuit 201d, the transistors are operated for switching by the voltage levels of the DC voltage sources $V_{b1}$, $V_{b2}$ so that the positive and negative voltage sides of the voltage waveform can be clipped by arbitrary voltage levels like the matching circuit shown in FIG. 10.

In the clipper circuit 201c shown in FIG. 10, when the amounts of DC currents flowing through the diodes are large, voltage drops are developed across the internal resistances of the DC voltage sources, thus changing the operating voltages of the diodes. However, by using the transistors shown in FIG. 11, it is possible to make the clipping operation with high precision because the voltage variation due to the internal resistances of the DC voltages sources can be neglected.

By arbitrarily selecting the voltage levels of DC voltages sources ($V_{b1}$, $V_{b2}$) in the clipper circuits 201c and 201d in FIGS. 10 and 11, it is possible to clip a sinusoidal voltage waveform of, for example, 800 kHz at arbitrary voltage levels. Thus, if the voltage waveform 303 is controlled by changing the DC voltage source ($V_b$), the energy distribution of ions incident to the sample 116 can be obtained as shown in FIGS. 4 and 8.

The same action/effect as in the first and second embodiments can be achieved by using the clipper circuit capable of clipping the positive and negative voltage sides of the voltage waveform at arbitrary voltage levels, and both characteristics can be obtained, so that the process window can be widened.

Thus, according to these embodiments, since the voltage waveform of RF voltage to the substrate electrode can be flattened, a bias voltage leading to an optimum ion energy distribution for each of various different processes can be applied to the substrate electrode, thus making it possible to process the surface of the sample with high precision.

In addition, since the increase of plasma potential can be suppressed by flattening the positive voltage side of the voltage waveform of RF voltage to the substrate electrode, the metal contaminant can be reduced with no sputtering of ions in the plasma to the inner wall of the processing chamber, and since the diffusion of plasma into the space below the processing chamber can be prevented, the foreign substances can be suppressed from increasing.

The clipper circuits shown in the first, second and third embodiments are not limited to the above-mentioned arrangements, but may be the clipper circuits generally used in the electronic circuits.

Figure 13:
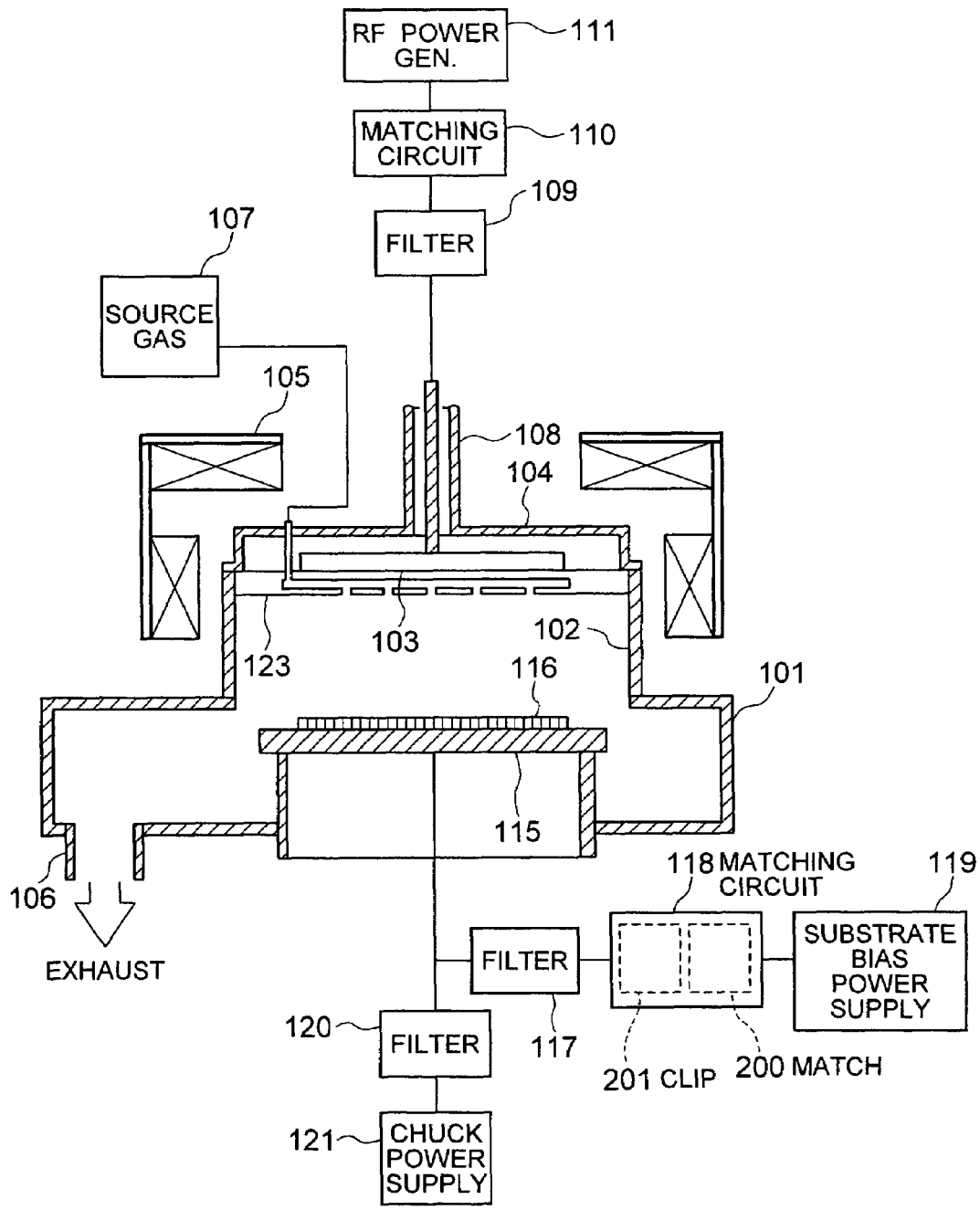
FIG. 13 is a longitudinally cross-sectional view of a plasma processing apparatus as the fourth embodiment of the invention.

While these embodiments are concerned with a static field-added UHF plasma processing apparatus having the antenna electrode within the vacuum vessel, the present invention can be applied to another field-added UHF plasma processing apparatus having the antenna electrode provided out of the vacuum vessel as shown in FIG. 13. The apparatus of FIG. 13 is different from the apparatus of FIG. 1 in that the processing chamber is formed and hermetically sealed y the walls of the process container 102 and a dielectric window 123 while the antenna electrode 103 is provided on the top thereof to be disposed on the outside of the processing chamber, or of the vacuum vessel, and that only the RF power source 111 for plasma generation is provided to supply RF power to the antenna electrode 103.

Figure 14:
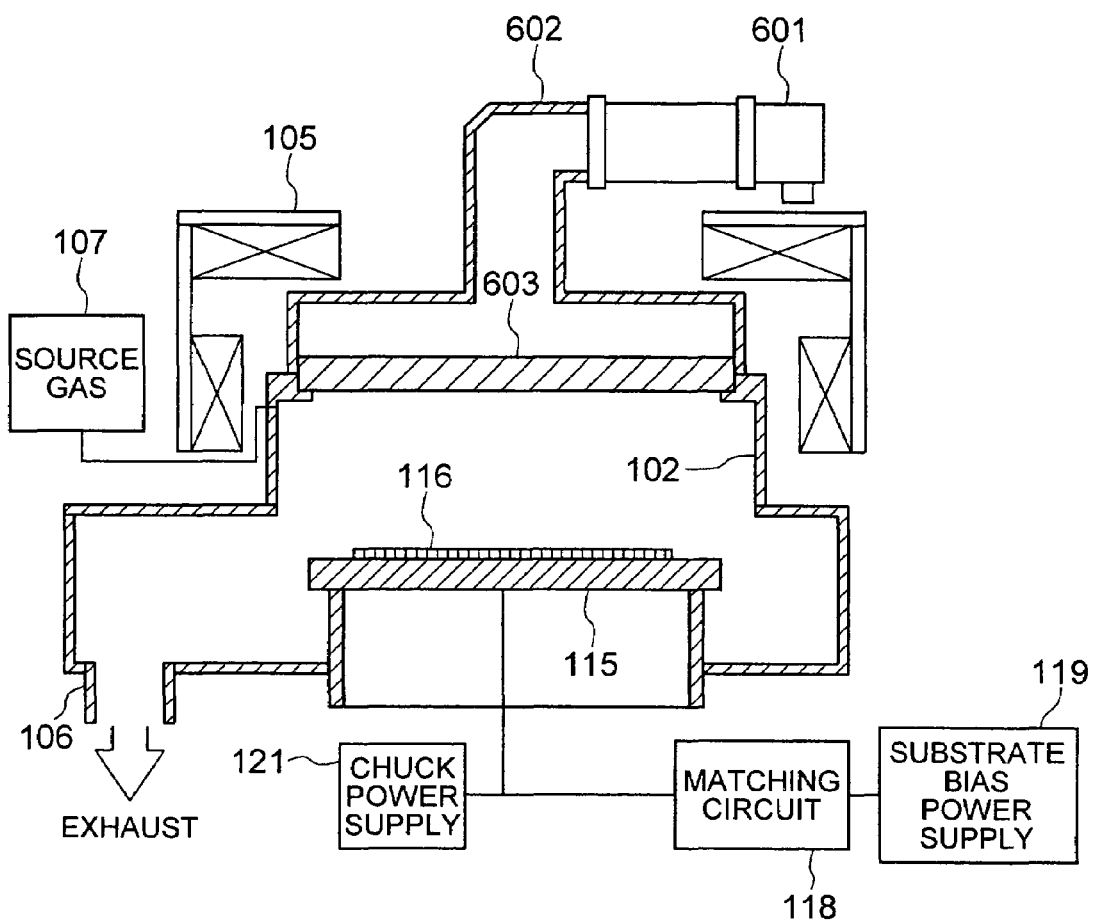
FIG. 14 is a longitudinally cross-sectional view of a plasma processing apparatus as the fifth embodiment of the invention.
Figure 15:
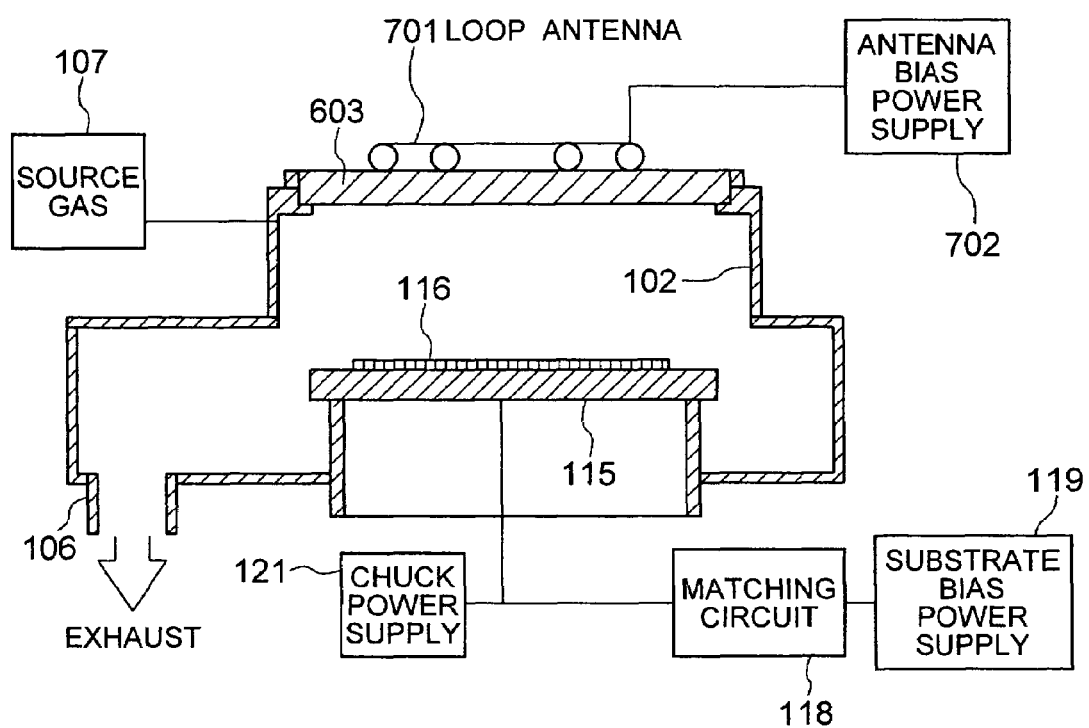
FIG. 15 is a longitudinally cross-sectional view of a plasma processing apparatus as the sixth embodiment of the invention.
Figure 16:
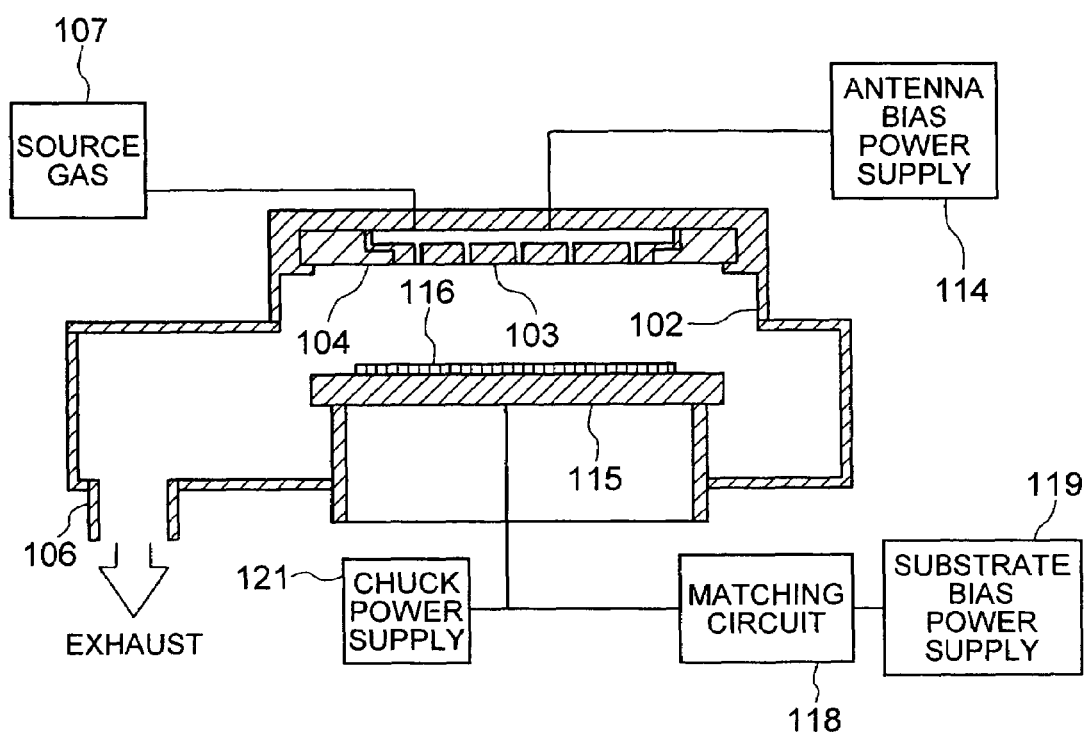
FIG. 16 is a longitudinally cross-sectional view of a plasma processing apparatus as the seventh embodiment of the invention.

Moreover, the present invention can be similarly applied to other apparatus than the UHF plasma processing apparatus, for example, CCP (capacitively coupled plasma), Dual-frequency plasma, SWP (surface wave excited plasma), magnetron apparatus, VHF plasma apparatus, and apparatus of TCP and ICP. FIGS. 14 through 16 show some of these apparatus. The apparatus shown in FIG. 14 has the processing chamber formed by providing a dielectric window 603 on the top opening of the process container 102 and hermetically sealed. The dielectric window 603 is connected through a wave guide tube 602 to a magnetron 601 which are provided above the dielectric window. The microwave of, for example, 2.45 GHz generated from the magnetron 601 propagates in the wave guide tube 602, and introduced through the dielectric window 603 into the processing chamber. The magnetic field of, for example, 875 G produced in the processing chamber from the field generating coil 105 interacts with the microwave introduced into the processing chamber to efficiently ionize the gas, thus producing plasma. In FIG. 14, like elements corresponding to those in FIG. 1 are identified by the same reference numerals, and will not be described.

The apparatus shown in FIG. 15 has the processing chamber formed by providing the dielectric window 603 on the top opening of the process container 102 and hermetically sealed. A loop antenna 701 is provided on the top of the dielectric window 603. The loop antenna 701 is connected to an antenna power supply 702 of, for example, 13.56 MHz. The RF power is supplied from the loop antenna 701 through the dielectric window 603 into the processing chamber, thereby generating plasma. In FIG. 15, like elements corresponding to those in FIG. 1 are identified by the same reference numerals, and will not be described.

The apparatus shown in FIG. 16 has the dielectric window 104 (made of, for example, quartz) and the top electrode, or antenna electrode 103 provided on the underside of the closed top of the process container 102 and hermetically sealed. The top electrode 103 is connected to an RF power supply 801 of, for example, 27 MHz or 60 MHz. The RF power is supplied from the top electrode 103 into the processing chamber, thereby generating plasma. In FIG. 16, like elements corresponding to those in FIG. 1 are identified by the same reference numerals, and will not be described.

Fourth Embodiment

Figure 17:
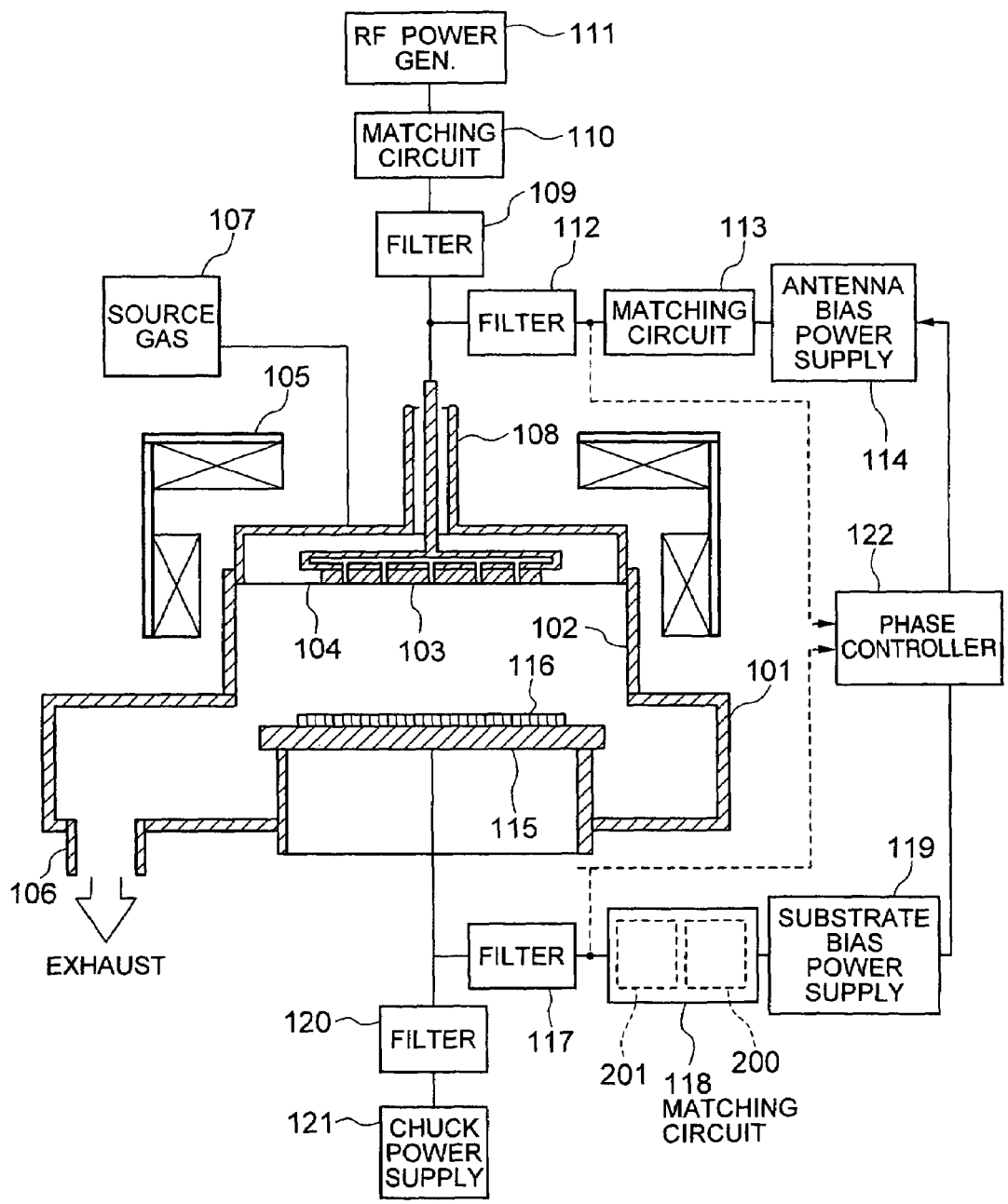
FIG. 17 is a longitudinally cross-sectional view of a plasma processing apparatus as the eighth embodiment of the invention.

The fourth embodiment of the invention will be described with reference to FIG. 17. In FIG. 17, like elements corresponding to those in FIG. 1 are identified by the same reference numerals, and will not be described. The aspect in FIG. 17 different from FIG. 1 will be described. The antenna biasing power supply 114 and substrate biasing power supply 119 are connected to the phase control 122, which can control the phases of the RF power from the antenna biasing power supply 114 and substrate biasing power supply 119. In this case, the frequencies of the RF power from the antenna biasing power supply 114 and substrate biasing power supply 119 are made equal to be, for example, 800 kHz.

The phase control 122 receives RF power signals from the junction between the filter 12 and matching circuit 113 on the antenna biasing power supply 114 side, and from the junction between the filter 117 and matching circuit 118 on the substrate biasing power supply 119, and shifts the phases of the RF power from the antenna biasing power supply 114 and substrate biasing power supply 119 to produce small-amplitude signals of which the phases are opposite to each other, or have a desired difference of 180°±45° in this case. The antenna biasing power supply 114 and substrate biasing power supply 119 in this case each may have only an amplifier function.

When the phase control 122 receives RF power signals from the junction between the filter 12 and matching circuit 113 on the antenna biasing power supply 114 side, and from the junction between the filter 117 and matching circuit 118 on the substrate biasing power supply 119, and produces only trigger signals that order the power supplies to timely generate the output power, the antenna biasing power supply 114 and substrate biasing power supply 119 each have an oscillator function.

When the phases of the RF voltages applied to the antenna electrode 103 and substrate electrode 115 are opposite to each other (preferably have a difference of 180°±30°), and if a positive voltage is applied to the substrate electrode 115, a negative voltage is applied to the antenna electrode 103. Thus, ions are incident to the antenna electrode 103, but electrons are not incident thereto, or an electron-rich state is brought to around the antenna electrode 103, while the opposite electrode efficiently functions as earth. Therefore, since the plasma potential is fixed to a voltage level of about 20~30 V that can be considered to be substantially 0 V relative to the peak voltage value of the RF voltage rather than the RF power, the ion energy controlling effect on the substrate electrode 115 side by the matching circuit 118 as in the previously mentioned embodiment 1 can be more precisely achieved. Accordingly, the charging damage can also be reduced.

The same clipper circuit as the clipper circuit 201 of the matching circuit 118 provided on the substrate electrode 115 side is provided in the matching circuit 113 on the antenna electrode 103 side, thus making it possible to further control the voltage waveform of the bias voltage to the antenna electrode 103, so that the processing window can be more widened.

Thus, according to the present invention, by adjusting the RF voltage waveform to the substrate electrode, it is possible to control the energy potential of ions and amount of ions in the ion energy distribution, and hence to make plasma processing with high precision and with less charging damage.

While these embodiments described above are concerned with the etching apparatus, the present invention can be similarly applied to other plasma processing apparatus such as ashing apparatus and plasma CVD apparatus for supplying RF power to the substrate electrode.

What is claimed is:

1. A plasma processing apparatus comprising:
   a processing chamber connected to a vacuum exhauster so that its inside pressure can be reduced by said vacuum exhauster;
   a gas feed unit for supplying gas into said processing chamber;
   a substrate electrode provided in said processing chamber and on which a sample can be placed;
   an RF power supply connected through a matching circuit to said substrate electrode, for applying an RF bias voltage having a waveform of a predetermined frequency to said substrate electrode by an RF power which is independently controlled with respect to another RF power applied for plasma generation;
   plasma generating means for generating plasma within said processing chamber; and
   a voltage waveform control circuit provided within said matching circuit or between said substrate electrode and said matching circuit to flatten the voltage waveform of said RF bias voltage applied to said substrate electrode by cutting off the bias voltage waveform at at least one voltage level for controlling an energy distribution of ions incident to said sample.

2. A plasma processing apparatus according to claim 1, wherein said voltage waveform control circuit includes a circuit for flattening the negative voltage side of said RF voltage waveform applied to said substrate electrode at an arbitrary voltage level.

3. A plasma processing apparatus according to claim 1, wherein said voltage waveform control circuit includes a circuit for flattening the positive voltage side of said RF voltage waveform applied to said substrate electrode at an arbitrary voltage level.

4. A plasma processing apparatus according to claim 1, wherein said voltage waveform control circuit includes circuits for flattening both negative and positive voltage sides of said RF voltage applied to said substrate electrode at arbitrary voltage levels.

5. A plasma processing apparatus according to claim 1, wherein said voltage waveform control circuit includes a semiconductor device and a DC voltage source.

6. A plasma processing apparatus according to claim 1, further comprising:
   an electrode opposite to said substrate electrode; and
   another RF power supply connected to said opposite electrode.

7. A plasma processing apparatus according to claim 6, wherein said RF voltages of the same frequency are applied to said two electrodes, and said apparatus further comprises a phase control for controlling the phases of said RF voltages.

8. A plasma processing apparatus comprising:
- a processing chamber connected to a vacuum exhauster so that its inside pressure can be reduced by said vacuum exhauster;
- a gas feed unit for supplying gas into said processing chamber;
- a substrate electrode provided in said processing chamber and on which a sample can be placed;
- an RF power supply connected through a matching circuit to said substrate electrode, for applying an RF bias voltage having a waveform of a predetermined frequency to said substrate electrode by an RF power which is independently controlled with respect to another RF power applied for plasma generation;
- plasma generating means for generating plasma within said processing chamber; and
- a voltage waveform control circuit provided within said matching circuit or between said substrate electrode and said matching circuit to flatten the voltage waveform of said RF bias voltage applied to said substrate electrode by cutting off positive and negative voltage sides of the bias voltage waveform at voltage levels for controlling an energy distribution of ions incident to said sample.

9. A plasma processing apparatus according to claim 8, wherein said voltage waveform control circuit includes a diode and a DC voltage source.

10. A plasma processing apparatus according to claim 8, further comprising:
- an electrode opposite to said substrate electrode; and
- another RF power supply connected to said opposite electrode.

11. A plasma processing apparatus according to claim 10, wherein said RF voltages of the same frequency are applied to said two electrodes, and said apparatus comprises a phase control for controlling the phases of said RF voltages.

12. A plasma processing apparatus according to claim 11, wherein said phase control can control said phases to have a difference of 180°±30°.

13. A plasma processing apparatus comprising:
- a processing chamber connected to a vacuum exhauster so that its inside pressure can be reduced by said vacuum exhauster;
- a gas feed unit for supplying gas into said processing chamber;
- a substrate electrode provided in said processing chamber and on which a sample can be placed;
- an RF power supply connected through a matching circuit to said substrate electrode, for applying an RF bias voltage having a waveform of a predetermined frequency to said substrate electrode by an RF power which is independently controlled with respect to another RF power applied for plasma generation; and
- a voltage waveform control circuit provided within said matching circuit or between said substrate electrode and said matching circuit to flatten the voltage waveform of said RF bias voltage applied to said substrate electrode by cutting off the bias voltage waveform at at least one voltage level for controlling an energy distribution of ions incident to said sample.

14. A plasma processing apparatus according to claim 13, wherein said voltage waveform control circuit can flatten the voltage waveform of at least one of positive and negative voltages of said RF voltage applied to said substrate electrode.

* * * * *